United States Patent
Rost et al.

(10) Patent No.: US 6,710,443 B1
(45) Date of Patent: Mar. 23, 2004

(54) INTEGRATED CIRCUIT PROVIDING THERMALLY CONDUCTIVE STRUCTURES SUBSTANTIALLY HORIZONTALLY COUPLED TO ONE ANOTHER WITHIN ONE OR MORE HEAT DISSIPATION LAYERS TO DISSIPATE HEAT FROM A HEAT GENERATING STRUCTURE

(75) Inventors: Timothy A. Rost, Plano, TX (US); William R. Hunter, Richardson, TX (US); Bradley S. Young, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 10/326,612

(22) Filed: Dec. 20, 2002

(51) Int. Cl.[7] ............................................. H01L 23/34
(52) U.S. Cl. .................. 257/712; 257/181; 257/508; 257/587; 257/675; 257/701
(58) Field of Search ................................ 257/712, 181, 257/508, 587, 675, 701

(56) References Cited

U.S. PATENT DOCUMENTS

| | | | | |
|---|---|---|---|---|
| 5,220,199 A | * | 6/1993 | Owada et al. ............... | 257/773 |
| 5,308,682 A | * | 5/1994 | Morikawa ................... | 428/195 |
| 5,338,967 A | * | 8/1994 | Kosaki ........................ | 257/620 |
| 6,100,199 A | * | 8/2000 | Joshi et al. .................. | 438/694 |
| 6,124,198 A | * | 9/2000 | Moslehi ....................... | 438/622 |
| 6,143,646 A | * | 11/2000 | Wetzel ......................... | 438/637 |
| 6,239,019 B1 | * | 5/2001 | Chiang et al. ............... | 438/624 |
| 6,242,807 B1 | * | 6/2001 | Kazami ....................... | 257/758 |
| 6,261,883 B1 | * | 7/2001 | Koubuchi et al. .......... | 438/197 |
| 6,309,956 B1 | * | 10/2001 | Chiang et al. ............... | 438/622 |
| 6,570,247 B1 | * | 5/2003 | Eiles et al. .................. | 257/707 |
| 2002/0074611 A1 | * | 6/2002 | Koubouchi et al. ......... | 257/401 |

FOREIGN PATENT DOCUMENTS

| | | | | |
|---|---|---|---|---|
| JP | 60-202956 | * | 10/1985 | ................... 257/722 |
| JP | 1-239873 | * | 9/1989 | ............ H01L/21/88 |

* cited by examiner

*Primary Examiner*—Jasmine Clark
(74) *Attorney, Agent, or Firm*—Rose Alyssa Keagy; W. James Brady, III; Frederick J. Telecky, Jr.

(57) ABSTRACT

In one embodiment, an integrated circuit includes a heat generating structure within a dielectric region and one or more substantially horizontally arranged heat dissipation layers within the dielectric region. Each heat dissipation layer includes electrically inactive thermally conductive structures, at least two such structures in at least one such layer being substantially horizontally connected and thermally coupled to one another within the layer. The electrically inactive thermally conductive structures cooperate to facilitate dissipation of heat from the heat generating structure. In another embodiment, an integrated circuit includes one or more heat generating structures within a dielectric region and electrically inactive thermal posts formed at least partially within the dielectric region. At least one such post is substantially horizontally connected and thermally coupled to another such post. The electrically inactive thermal posts cooperate to facilitate dissipation of heat from the one or more heat generating structures.

44 Claims, 6 Drawing Sheets

INTEGRATED CIRCUIT PROVIDING THERMALLY CONDUCTIVE STRUCTURES SUBSTANTIALLY HORIZONTALLY COUPLED TO ONE ANOTHER WITHIN ONE OR MORE HEAT DISSIPATION LAYERS TO DISSIPATE HEAT FROM A HEAT GENERATING STRUCTURE

TECHNICAL FIELD OF THE INVENTION

This invention relates generally to integrated circuits, and more particularly to an integrated circuit providing thermally conductive structures substantially horizontally coupled to one another within one or more heat dissipation layers to dissipate heat from a heat generating structure.

BACKGROUND OF THE INVENTION

During fabrication of an integrated circuit, isolated dummy metal structures may be inserted in the dielectric region of the integrated circuit interconnect layer to increase the density of metal structures on the top surface of the integrated circuit. For example, insertion of dummy metal structures may lead to improved pattern consistency of metal leads and to reduced "dishing" during chemical mechanical polishing (CMP) of the integrated circuit. Furthermore, when the integrated circuit is operational, heat generating structures such as metal leads may cause temperature increases internal to the integrated circuit due to Joule heating effects. Such temperature increases may accelerate wearout mechanisms such as electromigration and stress migration, possibly leading to failure of the integrated circuit. Current trends in integrated circuit design include using dielectric materials of increasingly low thermal conductivity, exacerbating the deleterious effects of Joule heating within the integrated circuit. Another trend is toward increasing the number of metal layers within the dielectric region, placing some metal layers further from a heat sinking interface such as the interface between the dielectric region and the underlying silicon or other integrated circuit substrate. In addition, as integrated circuit layout densities continue to escalate, it becomes increasingly difficult to dissipate heat from metal leads or other heat generating structures. Furthermore, integrated circuits that draw relatively large amounts of power may intensify the increases in temperature in the integrated circuit due to Joule heating effects.

The physics of heat flow in this case teaches that the temperature increase of a heat generating metal lead above the temperature of the substrate is proportional to: (1) heat generated inside the metal lead due to Joule heating caused by electrical current flowing through an electrical resistance, and (2) thermal resistance associated with typically three-dimensional heat, flow away from the heat generating metal lead and into the heat sinking substrate. As discussed previously, it is common practice to intersperse isolated islands of dummy metal throughout the dielectric region of the integrated circuit interconnect layer where electrically active metal leads are absent in the design. To decrease Joule heating effects, it may be desirable to dissipate heat from metal leads or other heat generating structures using dummy metal structures strategically inserted in the dielectric region of the integrated circuit interconnect layer. It may also be desirable to vertically connect these isolated islands of dummy metal with vias, referred to as dummy vias, for the sole purpose of improving the heat flow vertically downwards toward the heat sinking substrate.

SUMMARY OF THE INVENTION

According to the present invention, disadvantages and problems associated with previous techniques for dissipating heat from a heat generating structure in an integrated circuit may be reduced.

In one embodiment of the present invention, an integrated circuit includes a heat generating structure within a dielectric region. The dielectric region has a top surface and a bottom surface, the bottom surface of the dielectric region coupled to a substrate underlying the dielectric region. The integrated circuit also includes one or more substantially horizontally arranged heat dissipation layers within the dielectric region. Each heat dissipation layer includes a number of electrically inactive thermally conductive structures, at least two electrically inactive thermally conductive structures in at least one heat dissipation layer being substantially horizontally connected and thermally coupled to one another within the at least one heat dissipation layer. The electrically inactive thermally conductive structures operate cooperatively to facilitate dissipation of heat from the heat generating structure.

In a particular embodiment of the present invention, an integrated circuit includes one or more heating generating structures, such as a current carrying metal lead, embedded within a dielectric region of an integrated circuit interconnect layer. The dielectric region typically has at least one of its two surfaces—top and bottom—thermally coupled to an external heat sink by virtue of its packaging details. For example, heat flow may occur through the bottom surface connection to the integrated circuit substrate, although the invention applies to the case where the other or both surfaces are thermally coupled to external heat sinks. The integrated circuit also includes patterned electrically inactive dummy metal structures, which may in known techniques be connected vertically with dummy vias, improving heat flow between metal layers to the heat sinking substrate. In this embodiment, at least two electrically inactive dummy metal structures within a given metallization layer are connected with horizontally disposed metal connections which improve the heat flow horizontally. The horizontal connections between the previously isolated dummy metal structures can occur in either of the two natural orthogonal directions in which metal leads are typically patterned or in any other suitable direction. The horizontal connectivity may occur between many, and not just two, previously isolated dummy metal structures within a given metallization layer of the integrated circuit. In keeping with the physical principles discussed previously, the temperature increase of a heat generating metal lead will monotonically decrease as the degree of horizontal connectivity of all previously isolated dummy metal structures in its vicinity increases.

It may be desirable in certain embodiments to intentionally design in electrically inactive space around regions of high heat generation in order to create thermally optimized dummy metal structures which are both horizontally and vertically connected, thereby enabling minimum temperature rise within the region of high heat generation. One extension of this concept comprehends that the region of high heat generation may be caused by electrically active circuit elements such as transistors and diffused resistors which may be built in proximity to the substrate, rather than being caused by high heat generation in electrically active metal leads. In this case, an "umbrella" of connected dummy metal above this region may help to spread the heat flow to the substrate, resulting in reduced local temperatures. Analogous concepts may be applied, in other embodiments, in connection with dummy metal structures embedded within an integrated circuit package substrate.

In another embodiment of the present invention, an integrated circuit includes one or more heat generating structures within a dielectric region. The dielectric region has a top surface and a bottom surface, the bottom surface of the dielectric region coupled to a substrate underlying the dielectric region. The integrated circuit also includes a number of electrically inactive thermal posts formed at least partially within the dielectric region and exposed on the top surface of the dielectric region. At least one electrically inactive thermal post is substantially horizontally connected and thermally coupled to another electrically inactive thermal post. The electrically inactive thermal posts operate cooperatively to facilitate dissipation of heat from the heat generating structures.

In another particular embodiment of the present invention, an integrated circuit includes one or more heat generating structures within a dielectric region of an integrated circuit interconnect layer. The dielectric region typically has at least one of its two surfaces—top and bottom—thermally coupled to an external heat sink by virtue of its packaging details. The dummy metal is designed in architecturally to provide a regular array of electrically inactive thermal posts, including dummy metal structures vertically connected with dummy vias, extending for example from the lowest metallization layer near the substrate all the way through to flip-chip bonding pads. Within the chip design, as much dummy metal in the vicinity of each thermal post is horizontally connected to the thermal post as is permitted by the circuit design. The distance between thermal posts may be any practical value; distances between 100 μm to 1000 μm would typically be reasonable. Each thermal post may be connected through flip-chip bonding to a package substrate which is optimized for heat transfer in much the same way as the chip itself is optimized. That is, the flip-chip package may also have electrically inactive dummy metal structures which are vertically and horizontally connected to enable optimal heat flow to the heat sink of the package.

Particular embodiments of the present invention may provide one or more technical advantages. For example, certain embodiments may exploit the three-dimensional nature of heat flow to improve dissipation of heat from a metal lead or other heat generating structure in an integrated circuit. Improved dissipation of heat may decrease the deleterious effects of temperature increases due to Joule heating effects internal to the integrated circuit when the integrated circuit is operational, decreasing wearout mechanisms such as electromigration and stress migration and possibly decreasing the likelihood that the integrated circuit will fail. Improved dissipation of heat may also allow for integrated circuits with increased layout densities, integrated circuits that draw greater power, or other benefits. Certain embodiments of the present invention may provide all, some, or none of the above advantages. Certain embodiments may provide one or more other technical advantages, one or more of which may be readily apparent to those skilled in the art from the figures, descriptions, and claims included herein.

BRIEF DESCRIPTION OF THE DRAWINGS

For a more complete understanding of the present invention and features and advantages thereof, reference is now made to the following description, taken in conjunction with the accompanying drawings, in which.

DESCRIPTION OF EXAMPLE EMBODIMENTS

Figure 1:
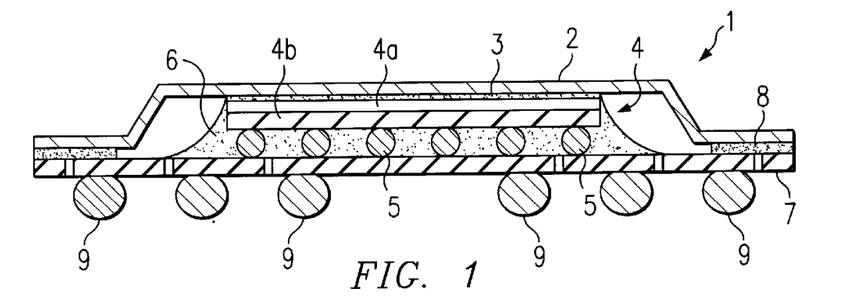
FIG. 1 illustrates an example integrated circuit package associated with an example flip-chip bonding packaging technique.

FIG. 1 illustrates an example integrated circuit package 1 associated with an example flip-chip bonding packaging technique. In one embodiment, package 1 includes a metal lid 2 coupled using a thermal adhesive 3 to an integrated circuit interconnect layer 4. Interconnect layer 4 includes a silicon or other substrate 4a coupled to a dielectric region 4b. Interconnect layer 4 may be coupled using solder balls 5 and epoxy underfill 6 to integrated circuit package substrate 7. Metal lid 2 may be further coupled to package substrate 7 using a suitable adhesive 8. Solder balls 9 arranged in a ball grid array (BGA) may be provided for coupling package 1 to the remainder of an electronic device that includes package 1. Although an example integrated circuit package 1 is illustrated and described, the present invention contemplates any suitable integrated circuit environment.

Figure 2:
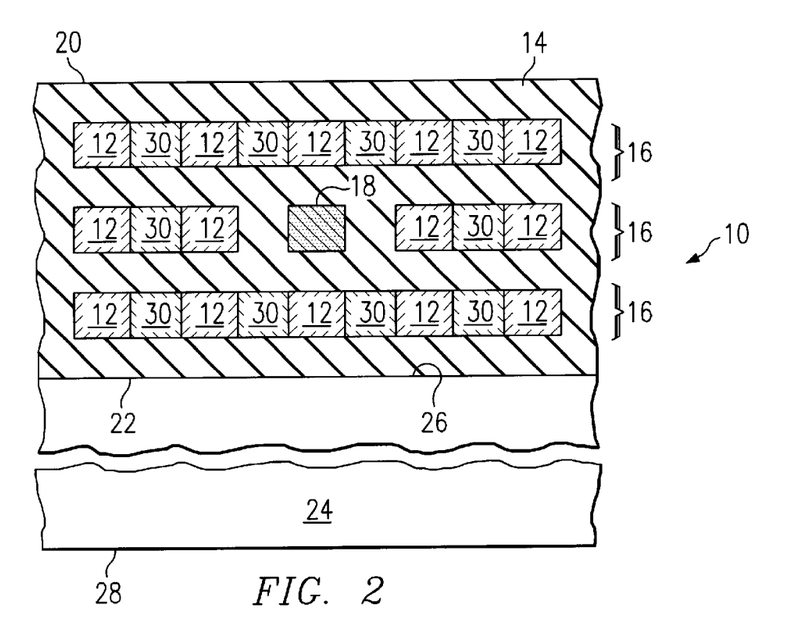
FIG. 2 illustrates a cross-sectional view of an example integrated circuit including electrically inactive thermally conductive structures embedded within a dielectric region and horizontally coupled to one another within a number of heat dissipation layers.

FIG. 2 illustrates a cross-sectional view of an example integrated circuit 10 including electrically inactive thermally conductive structures 12 embedded within a dielectric region 14 and horizontally coupled to one another within a number of heat dissipation layers 16. In general, electrically inactive thermally conductive structures 12 cooperate to dissipate heat from one or more heat generating structures 18 within integrated circuit 10. Integrated circuit 10 may be a digital signal processor (DSP) or any other suitable type of integrated circuit. Dielectric region 14, having a top surface 20 and a bottom surface 22, and a silicon or other substrate 24 underlying dielectric region 14. Dielectric region 14 may include layers containing silicon dioxide, silicon nitride, or any other suitable dielectric material. As shown, dielectric region 14 may lie within an integrated circuit interconnect layer (such as interconnect layer 4 illustrated in FIG. 1 for example) that includes dielectric region 16 and underlying substrate 24. Instead or in addition, although not explicitly shown, analogous concepts may be employed with respect to an analogous dielectric region within an integrated circuit package substrate (such as package substrate 7 illustrated in FIG. 1 for example).

Integrated circuit 10 includes within dielectric region 14 one or more metal leads or other heat generating structures 18. Integrated circuit 10 may also include within dielectric region 14 one or more horizontally arranged heat dissipation layers 16, each including a number of dummy metal or other electrically inactive thermally conductive structures 12. Heat generating structure 18 and thermally conductive structures 12 may include copper, aluminum, tungsten, or any other suitable metal or metal alloy. In one embodiment, thermally conductive structures 12 include the same conductive material used to form the circuitry in integrated circuit 10. As used herein, the term "horizontal" is meant to refer generally to the planes of the surfaces of dielectric region 14 and substrate 24, and the term "vertical" is meant to refer generally to a direction perpendicular to those planes. In one embodiment, each thermally conductive structure 12 within a heat dissipation layer 14 is substantially horizontally connected and thermally coupled to at least one other thermally conductive structure 12 within the same heat dissipation layer 14 using a substantially horizontal thermal connection 30. Thermal connections 30 may be formed, for example, from the same metal or metal alloy used to form heat generating structures 18 or thermally conductive structures 12. When thermally coupled to one another with connections 30, thermally conductive structures 12 cooperate to dissipate heat from heat generating structure 18.

Integrated circuit 10 may include any suitable number of heat generating structures 18, heat dissipation layers 16, thermally conductive structures 12, and connections 30 according to particular needs. In one embodiment, integrated circuit 10 includes at least one heat dissipation layer 14 in which at least two thermally conductive structures 12 are substantially horizontally connected and thermally coupled to one another using a thermal connection 30. Increasing the number of heat dissipation layers 16 or the number of thermally conductive structures 12 thermally coupled to one another may increase the amount of heat dissipated from heat generating structure 18, but possibly at the cost of design density. To achieve an optimum level of heat dissipation, a balance must typically be struck according to applicable thermal management and integrated circuit design considerations. For example, such thermal management considerations may include the quantity of Joule heating to control versus capacitance constraints or layout area constraints in integrated circuit 10.

In one embodiment, blanks may be intentionally created in dielectric region 14 during the fabrication of integrated circuit 10 for depositing thermally conductive structures 12 and connections 30, making the placement of thermally conductive structures 12 and connections 30 an intelligent step in designing integrated circuit 10. This may permit optimization of space between multiple heat dissipation layers 16 and optimization of space between thermally conductive structures 12 within a particular heat dissipation layer 14 to achieve a predetermined level of heat dissipation, according to applicable thermal management and integrated circuit design considerations.

Although integrated circuit 10 is illustrated as two-dimensional, those skilled in the art will appreciate that the teachings of the present invention may be extended into three dimensions (i.e. into and out of the page when viewing FIG. 2). Additionally, although heat dissipation layers 16 and thermal connections 30 are illustrated and described as being substantially horizontal, the present invention contemplates horizontally adjacent thermally conductive structures 12 within a heat dissipation layer 16 that are not at exactly the same vertical level within dielectric region 14. Thus, the present invention encompasses adjacent thermally conductive structures 12 generally forming a "layer" that is substantially horizontal. Furthermore, although thermally conductive structures 12 within each heat dissipation layer 14 are shown as being essentially the same size and shape, and as being patterned in a regular lattice-like arrangement, the present invention contemplates thermally conductive structures 12 having any suitable size and shape, thermally conductive structures 12 varying in size and shape within the same integrated circuit 10, there being varying distances between thermally conductive structures 12 within a heat dissipation layer 16, there being varying distances between heat dissipation layers 16, thermally conductive structures 12 in one heat dissipation layer 16 being offset horizontally from thermally conductive structures 12 in another heat dissipation layer 16, and other variations according to particular needs. The present invention, for example, contemplates omission of one or more thermal connections 30 and omission of one or more thermally conductive structures 12.

Figure 3:
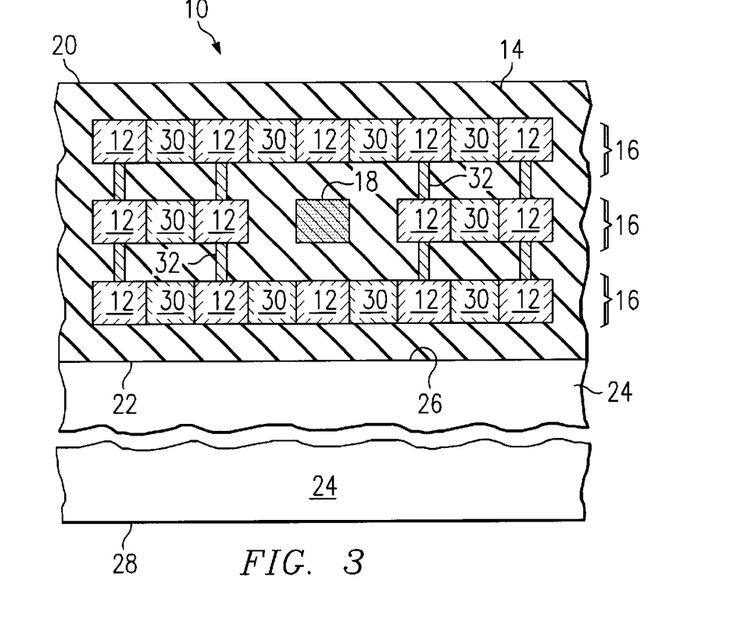
FIG. 3 illustrates a cross-sectional view of an example integrated circuit in which electrically inactive thermally conductive structures within different heat dissipation layers of the integrated circuit are vertically coupled to one another.

In addition to certain structures described above with reference to FIG. 2, FIG. 3 illustrates a cross-sectional view of example integrated circuit 10 in which electrically inactive thermally conductive structures 12 within different heat dissipation layers 16 of integrated circuit 10 are vertically coupled to one another. In the illustrated embodiment, at least one thermally conductive structure 12 in one heat dissipation layer 16 is thermally coupled to at least one thermally conductive structure 12 in another heat dissipation layer 16 via a thermal connection 32. In one embodiment, it may be desirable to include both thermal connections 30 and thermal connections 32 to connect thermally conductive structures 12. This may improve utilization of the three-dimensional nature of heat flow, further facilitating dissipation of heat from heat generating structure 18. The number and position of thermal connections 30 and thermal connections 32 may be intelligently determined according to applicable thermal management and integrated circuit design considerations.

In addition to certain structures described above with reference to FIGS. 2 and 3, FIG. 4 illustrates a cross-sectional view of an example integrated circuit 10 in which one or more electrically inactive thermally conductive structures 34 coupled to top surface 20 of dielectric region 14 are thermally coupled via thermal connections 32 to one or more electrically inactive thermally conductive structures 12 within a heat dissipation layer 16. Thermally conductive structures 34 may include thermal ground planes, thermal bond pads, thermal balls or bumps, or any other suitable thermally conductive structures according to particular needs. Thermally conductive structures 34 may include copper, aluminum, tungsten, or any other metal or metal alloy suitable for use as a thermally conductive structure. The present invention contemplates any suitable number of thermally conductive structures 34 coupled to top surface 20 of dielectric region 14. In addition, any suitable number of thermally conductive structures 12 may be connected and thermally coupled to thermally conductive structures 34 via thermal connections 32. For example, it may be desirable to include thermal connections 32 to a thermally conductive structures 34 in a heat-critical region of integrated circuit 10.

Figure 4:
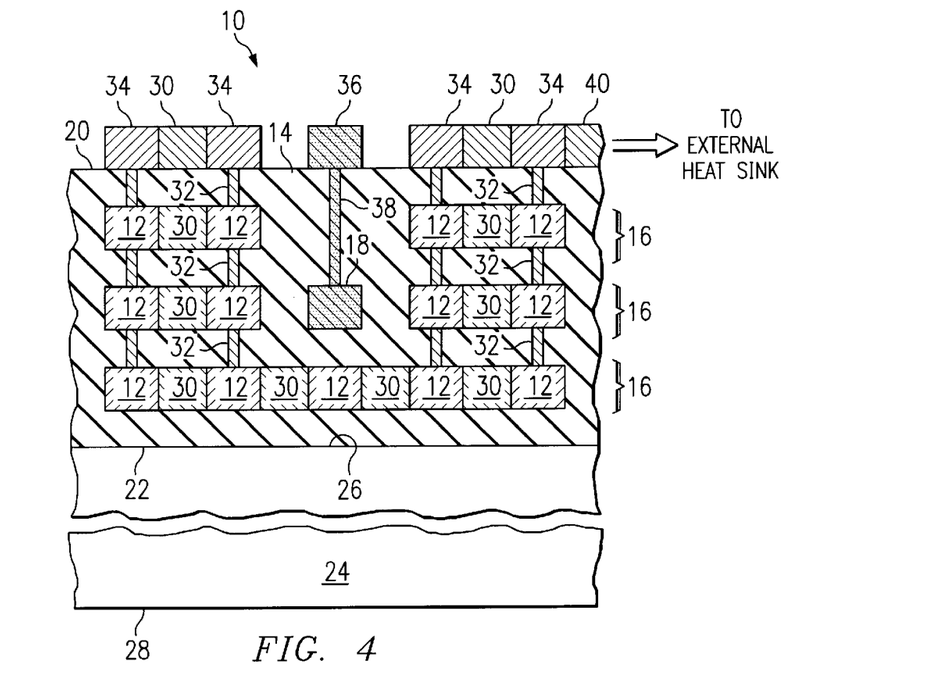
FIG. 4 illustrates a cross-sectional view of an example integrated circuit in which electrically inactive thermally conductive structures coupled to a top surface of a dielectric region are thermally coupled to electrically inactive thermally conductive structures within one or more heat dissipation layers of the integrated circuit, forming a thermal post.

A series of two or more thermally conductive structures thermally coupled using thermal connections 32, including at least one thermally conductive structure 12 embedded within dielectric region 14 and possibly including a thermally conductive structure 34 on top surface 20 of dielectric region 14, may be referred to as a thermal post. Similarly, a series of two or more electrically active structures electrically coupled using electrical connections, including at least one heat generating structure 18 embedded within dielectric region 14 and possibly including an electrically active structure 36 on top surface 20 of dielectric region 14 connected to heat generating structure 18 via an electrical connection 38, may be referred to as an electrically active post. Applying concepts similar to those described in connection with FIGS. 2 and 3, two or more thermally conductive structures 34, each being part of or thermally coupled to a thermal post, may be coupled to one another via thermal connections 30 on top surface 20 of dielectric region 14. Furthermore, one or more thermally conductive structures 34, each being part of or thermally coupled to at least one thermal post, may be further thermally coupled via thermal connections 40 to one or more external heat sinks of integrated circuit package 1, where thermal connections 40 may extend beyond the perimeter of integrated circuit 10.

Figure 5:
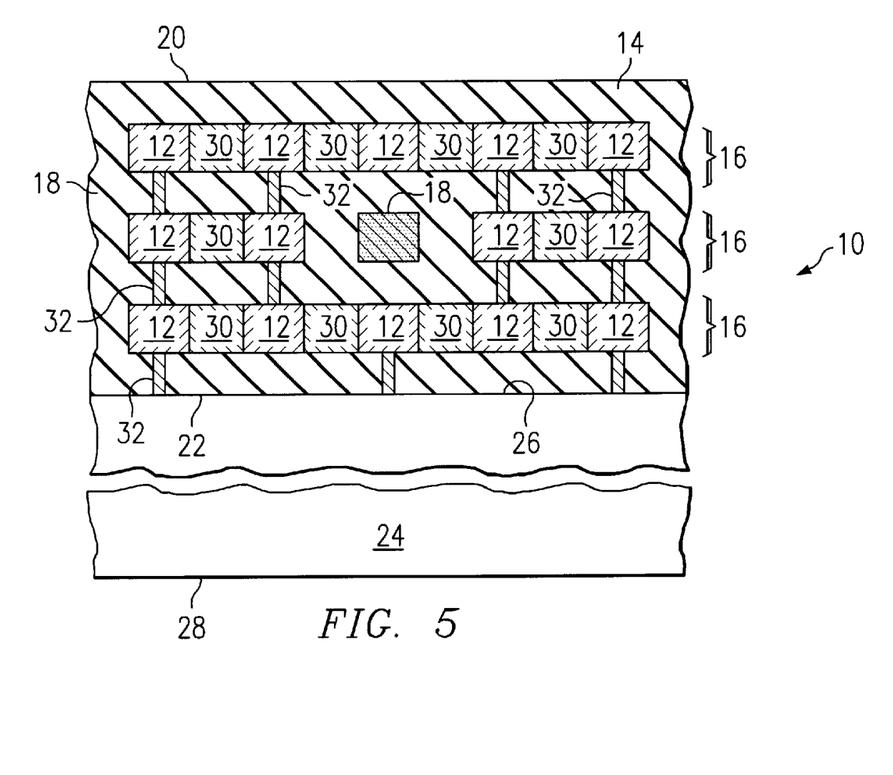
FIG. 5 illustrates a cross-sectional view of an example integrated circuit in which electrically inactive thermally conductive structures within a heat dissipation layer of the integrated circuit are thermally coupled to a substrate underlying the dielectric region.

In addition to certain structures described above with reference to FIGS. 2 and 3, FIG. 5 illustrates a cross-sectional view of an example integrated circuit 10 in which one or more electrically inactive thermally conductive structures 12 within a heat dissipation layer 16 of integrated circuit 10 are thermally coupled to substrate 24 underlying dielectric region 14 to further dissipate heat from heat generating structure 18.

Figure 6:
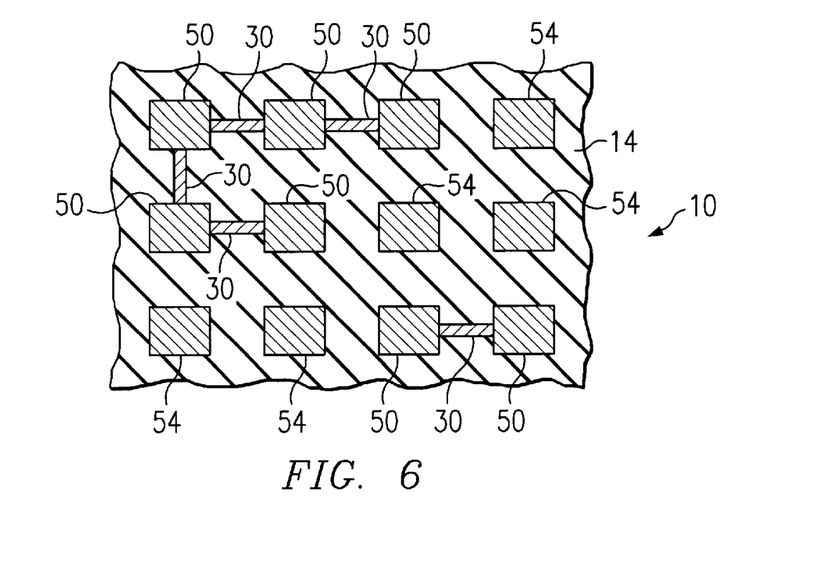
FIG. 6 illustrates a top view of an example integrated circuit in which a number of electrically inactive thermal posts are exposed on a top surface of a dielectric region.

FIG. 6 illustrates a top view of an example integrated circuit 10 in which a number of electrically inactive thermal posts 50 are exposed on top surface 20 of dielectric region 14. Each exposed thermal post 50 includes a thermally conductive structure 34 and at least one thermally conductive structure 12 connected to one another via a thermal connection 32. A thermal post 50 may include as many thermally conductive structures 12 and associated thermal connections 32 as are appropriate. A thermal post 50 may be substantially horizontally connected and thermally coupled to one or more other thermal posts 50 via thermal connections 30. Any suitable number of connections 30 may be provided. Thermal posts 50 may be substantially horizontally connected and thermally coupled within dielectric region 14 (i.e. thermal coupling of thermally conductive structures 12), on top surface 20 of dielectric region 14 (i.e. thermal coupling of thermally conductive structures 34), or both. Thermal posts 50 may include any metal or other material suitable for use as a thermal post. Integrated circuit 10 may also include a number of exposed electrically active posts 54, each including an electrically active structure 36 exposed on top surface 20 of dielectric region 18 and electrically connected to one or more heat generating structures 18 within dielectric region 14 via electrical connections 38. The present invention contemplates any suitable ratio of thermal posts 50 to electrically active posts 54. The number and position of thermal posts 50 and electrically active posts 54 may be intelligently determined according to applicable thermal management and integrated circuit design considerations.

Figure 7A:
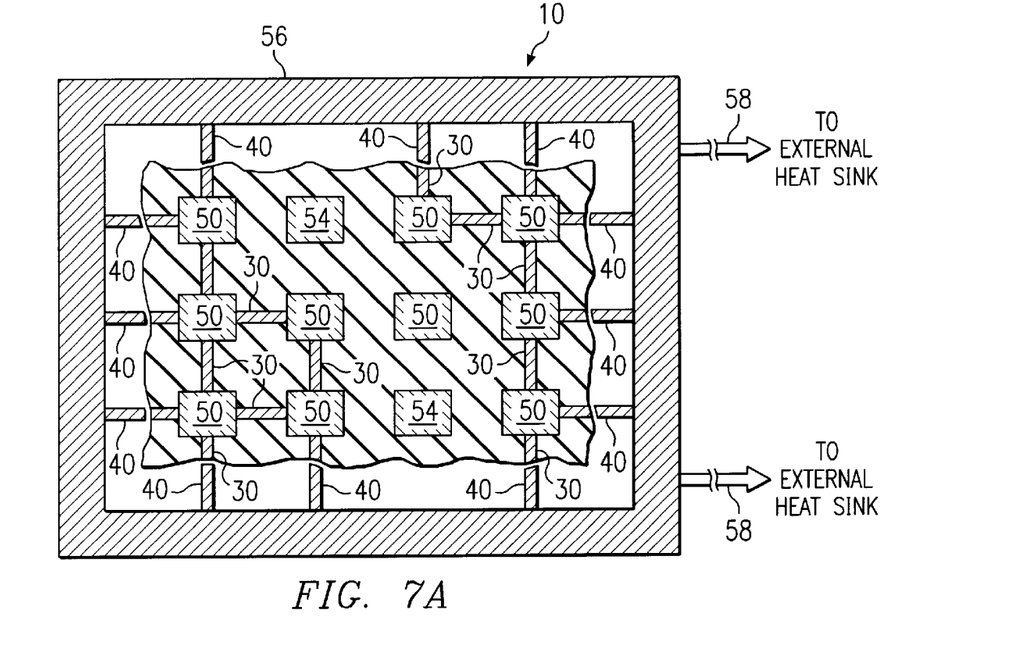
FIGS. 7A and 7B illustrate top views of example integrated circuits in which a number of electrically inactive thermal posts are thermally coupled to an electrically inactive thermally conductive border that substantially surrounds the integrated circuit.
Figure 7B:
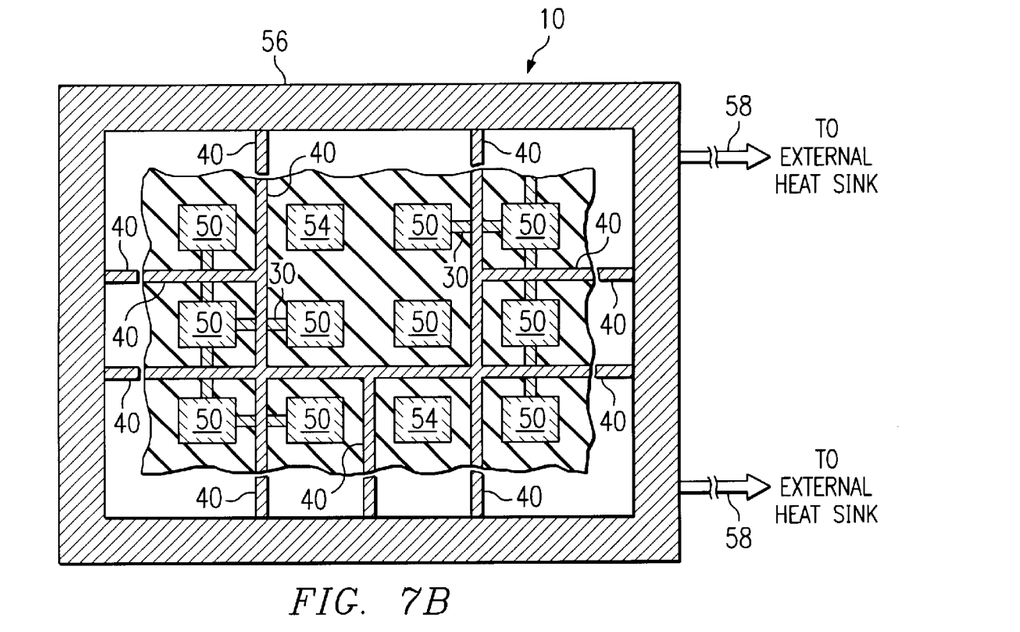

In addition to certain structures described above with reference to FIG. 6, FIGS. 7A and 7B illustrate top views of example integrated circuits 10 in which a number of thermal posts 50 are thermally coupled to an electrically inactive thermally conductive ring or other border 56 that substantially surrounds integrated circuit 10. Thermal posts 50 may be substantially horizontally connected and thermally coupled to thermally conductive border 56 via thermal connections 40, where thermal connections 40 extend beyond the perimeter of integrated circuit 10. Thermal connections 40 may be arranged and coupled to thermal posts 50 and border 56 as illustrated in FIG. 7A, as illustrated in FIG. 7B, according to a combination of these arrangements, or in any other suitable manner. Thermally coupling thermally conductive posts 50 to thermally conductive border 56 may further facilitate dissipation of heat from heat generating structures 18 within dielectric region 14. Thermally conductive border 56 may include a metal, metal alloy, or any other material suitable for use as a thermally conductive border. Thermally conductive border 56 may itself be thermally coupled to one or more suitable external heat sinks, such as one or more chassis screws for example, via thermal connections 58.

Figure 8:
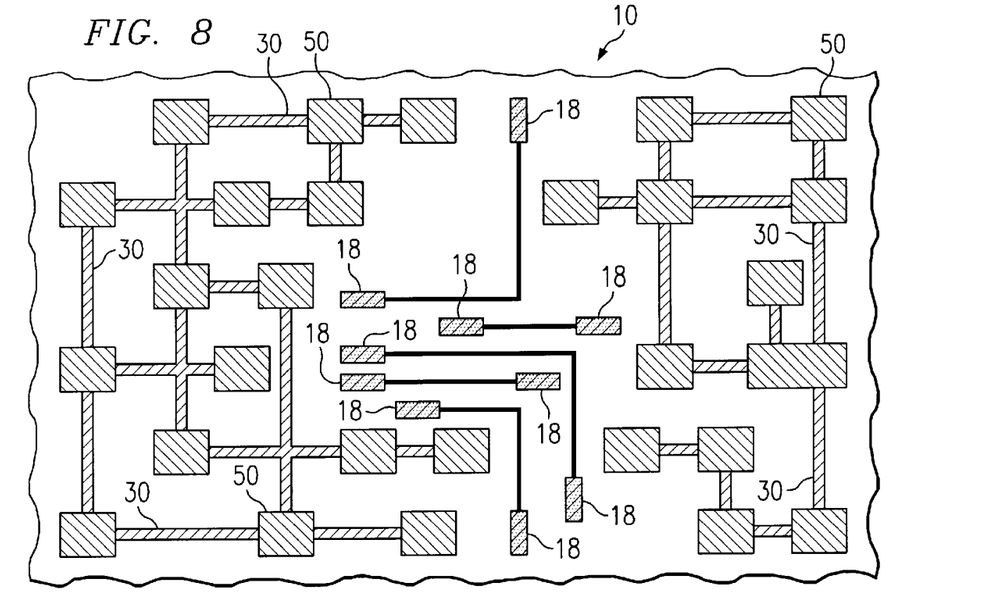
FIG. 8 illustrates an example integrated circuit in which electrically inactive thermal posts are arranged about one or more heat generating structures.

In addition to certain structures described above with reference to FIG. 6, FIG. 8 illustrates an example integrated circuit 10 in which electrically inactive thermal posts 50 are arranged about one or more heat generating structures 18. In this example, the positions of heat generating structures 18 are determined and heat generating structures 18 are placed in integrated circuit 10 before arrangement of thermal posts 50. Thermal posts 50 may cooperate to dissipate heat from heat generating structures 18. In certain embodiments, determining the positions of heat generating structures 18 and placing heat generating structures 18 in integrated circuit 10 before arrangement of thermal posts 50 may be preferred according to applicable thermal management and integrated circuit design considerations.

Figure 9:
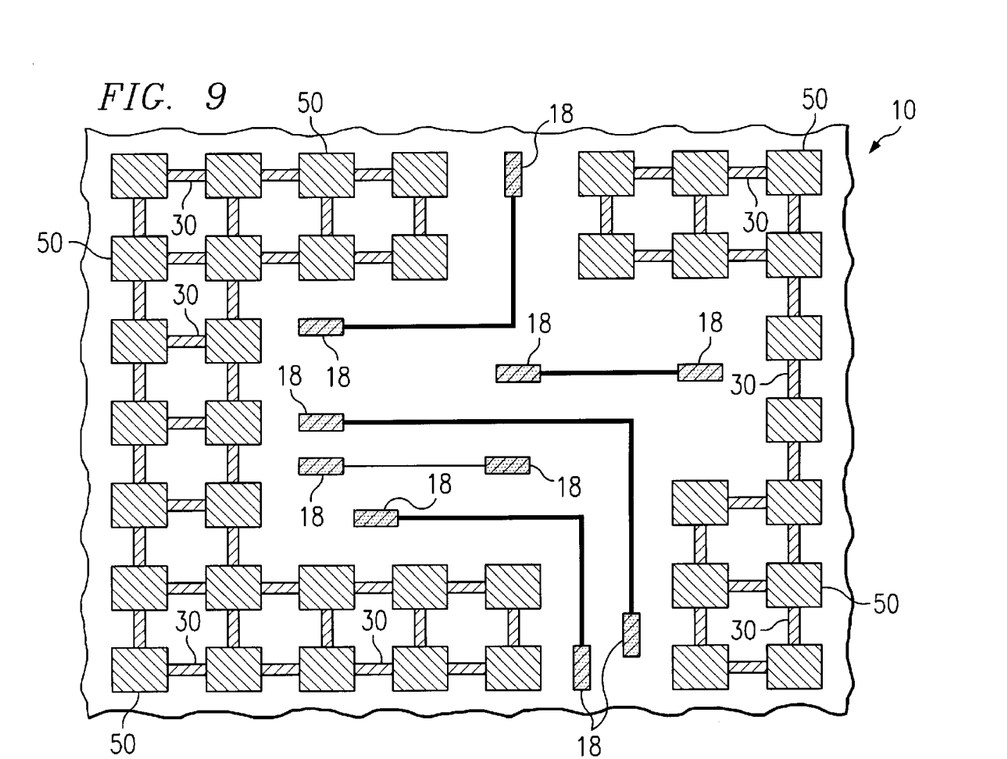
FIG. 9 illustrates an example integrated circuit in which a number of heat generating structures are arranged according to the locations of electrically inactive thermal posts.

In addition to certain structures described above with reference to FIG. 6, FIG. 9 illustrates an example integrated circuit 10 in which a number of heat generating structures 18 are arranged according to the locations of electrically inactive thermal posts 50. In this example, the positions of thermal posts 50 are determined and thermal posts 50 are placed in integrated circuit 10 before arrangement of heat generating structures 18. Thermal posts 50 may cooperate to dissipate heat from heat generating structures 18. In certain embodiments, determining positions of thermal posts 50 and placing thermal posts 50 in integrated circuit 10 before arrangement of heat generating structures 18 may be preferred according to applicable thermal management and integrated circuit design considerations.

FIGS. 2–9 illustrate various example embodiments of the present invention. Those skilled in the art will appreciate that various combinations of the example embodiments described above, as well as others not explicitly described, are within the spirit and scope of the present invention. The present invention contemplates any appropriate combinations of features of these example embodiments.

Figure 10:
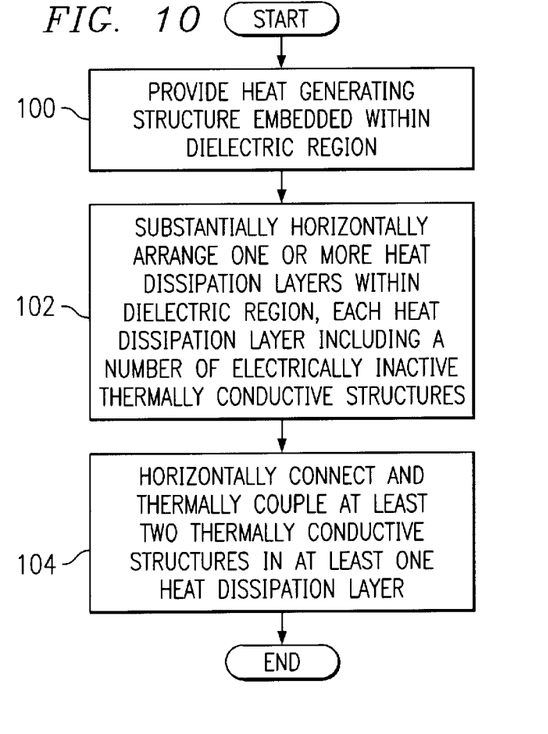
FIG. 10 illustrates an example method of fabricating an integrated circuit using electrically inactive thermally conductive structures horizontally coupled to one another within one or more heat dissipation layers to dissipate heat from a heat generating structure.

FIG. 10 illustrates an example method of fabricating integrated circuit 10 using electrically inactive thermally conductive structures 12 horizontally coupled to one another within one or more heat dissipation layers 16 to dissipate heat from heat generating structure 18. At step 100, heat generating structure 18 is provided within dielectric region 14. At step 102, one or more heat dissipation layers 16 are substantially horizontally arranged within dielectric region 14, each heat dissipation layer 16 including a number of electrically inactive thermally conductive structures 12. At step 104, at least two thermally conductive structures 12 in at least one heat dissipation layer 16 are substantially horizontally connected and thermally coupled to one another. Thermally conductive structures 12, operating cooperatively, facilitate dissipation of heat from heat generating structure 18. In practice, the steps of the method may be performed in any suitable order and may overlap in whole or in part according to integrated circuit fabrication considerations.

Figure 11:
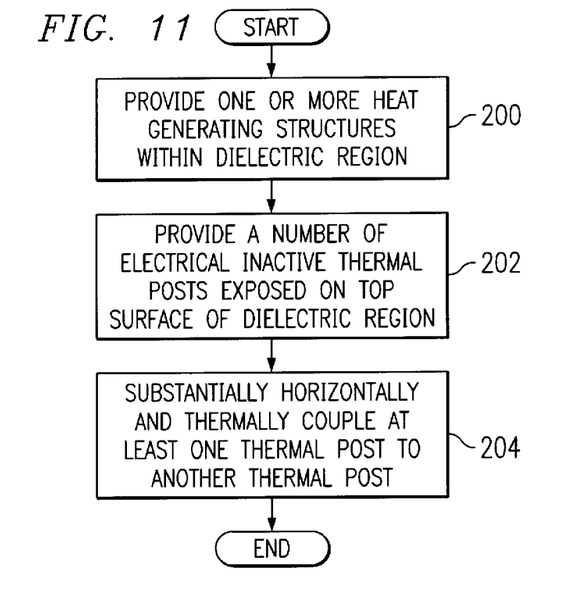
FIG. 11 illustrates an example method for fabricating an integrated circuit using a number of electrically inactive thermal posts horizontally coupled to one another to dissipate heat from a heat generating structure.

FIG. 11 illustrates an example method for fabricating integrated circuit 10 using a number of electrically inactive thermal posts 50 horizontally coupled to one another to dissipate heat from heat generating structure 18. At step 200, one or more heat generating structures 18 are provided within dielectric region 14. At step 202, a number of thermal posts 50, which are exposed on a top surface 20 of dielectric region 14, are provided. In one embodiment, thermal posts 50 are arranged about the one or more heat generating structures 18, the positions of the one or more heat generating structures 18 having been determined and the one or more heat generating structures 18 having been placed in integrated circuit 10 before arrangement of thermal posts 50. In another embodiment, the one or more heat generating structures 18 are arranged according to the locations of electrically inactive thermal posts 50, the positions of thermal posts 50 having been determined and thermal posts 50 having been placed in integrated circuit 10 before arrangement of the one or more heat generating structures 18. At step 204, at least one thermal post 50 is substantially horizontally and thermally coupled to another thermal post 50 to facilitate dissipation of heat from the one or more heat generating structures 18. In practice, the steps of the method may be performed in any suitable order and may overlap in whole or in part according to integrated circuit fabrication considerations.

In one embodiment of the present invention, an integrated circuit includes a heat generating structure within a dielectric region. The dielectric region has a top surface and a bottom surface, the bottom surface of the dielectric region coupled to a substrate underlying the dielectric region. The integrated circuit also includes one or more substantially horizontally arranged heat dissipation layers within the dielectric region. Each heat dissipation layer includes a number of electrically inactive thermally conductive structures, at least two electrically inactive thermally conductive structures in at least one heat dissipation layer being substantially horizontally connected and thermally coupled to one another within the at least one heat dissipation layer. The electrically inactive thermally conductive structures operate cooperatively to facilitate dissipation of heat from the heat generating structure.

In a particular embodiment of the present invention, an integrated circuit includes one or more heating generating structures, such as a current carrying metal lead, embedded within a dielectric region of an integrated circuit interconnect layer. The dielectric region typically has at least one of its two surfaces - top and bottom thermally coupled to an external heat sink by virtue of its packaging details. For example, heat flow may occur through the bottom surface connection to the integrated circuit substrate, although the invention applies to the case where the other or both surfaces are thermally coupled to external heat sinks. The integrated circuit also includes patterned electrically inactive dummy metal structures, which may in known techniques be connected vertically with dummy vias, improving heat flow between metal layers to the heat sinking substrate. In this embodiment, at least two electrically inactive dummy metal structures within a given metallization layer are connected with horizontally disposed metal connections which improve the heat flow horizontally. The horizontal connections between the previously isolated dummy metal structures can occur in either of the two natural orthogonal directions in which metal leads are typically patterned or in any other suitable direction. The horizontal connectivity may occur between many, and not just two, previously isolated dummy metal structures within a given metallization layer of the integrated circuit. In keeping with the physical principles discussed previously, the temperature increase of a heat generating metal lead will monotonically decrease as the degree of horizontal connectivity of all previously isolated dummy metal structures in its vicinity increases.

It may be desirable in certain embodiments to intentionally design in electrically inactive space around regions of high heat generation in order to create thermally optimized dummy metal structures which are both horizontally and vertically connected, thereby enabling minimum temperature rise within the region of high heat generation. One extension of this concept comprehends that the region of high heat generation may be caused by electrically active circuit elements such as transistors and diffused resistors which may be built in proximity to the substrate, rather than being caused by high heat generation in electrically active metal leads. In this case, an "umbrella" of connected dummy metal above this region may help to spread the heat flow to the substrate, resulting in reduced local temperatures. Analogous concepts may be applied, in other embodiments, in connection with dummy metal structures embedded within an integrated circuit package substrate.

In another embodiment of the present invention, an integrated circuit includes one or more heat generating structures within a dielectric region. The dielectric region has a top surface and a bottom surface, the bottom surface of the dielectric region coupled to a substrate underlying the dielectric region. The integrated circuit also includes a number of electrically inactive thermal posts formed at least partially within the dielectric region and exposed on the top surface of the dielectric region. At least one electrically inactive thermal post is substantially horizontally connected and thermally coupled to another electrically inactive thermal post. The electrically inactive thermal posts operate cooperatively to facilitate dissipation of heat from the heat generating structures.

In another particular embodiment of the present invention, an integrated circuit includes one or more heat generating structures within a dielectric region of an integrated circuit interconnect layer. The dielectric region typically has at least one of its two surfaces—top and bottom—thermally coupled to an external heat sink by virtue of its packaging details. The dummy metal is designed in architecturally to provide a regular array of electrically inactive thermal posts, including dummy metal structures vertically connected with dummy vias, extending for example from the lowest metallization layer near the substrate all the way through to flip-chip bonding pads. Within the chip design, as much dummy metal in the vicinity of each thermal post is horizontally connected to the thermal post as is permitted by the circuit design. The distance between thermal posts may be any practical value; distances between 100 $\mu$m to 1000 $\mu$m would typically be reasonable. Each thermal post may be connected through flip-chip bonding to a package substrate which is optimized for heat transfer in much the same way as the chip itself is optimized. That is, the flip-chip package may also have electrically inactive dummy metal structures which are vertically and horizontally connected to enable optimal heat flow to the heat sink of the package.

Particular embodiments of the present invention may provide one or more technical advantages. For example, certain embodiments may exploit the three-dimensional nature of heat flow to improve dissipation of heat from a metal lead or other heat generating structure 18 in integrated circuit 10. Improved dissipation of heat may decrease the deleterious effects of temperature increases due to Joule heating effects internal to integrated circuit 10 when integrated circuit 10 is operational, decreasing wearout mechanisms such as electromigration and stress migration and possibly decreasing the likelihood that integrated circuit 10 will fail. Improved dissipation of heat may also allow for integrated circuits with increased layout densities, integrated circuits that draw greater power, or other benefits.

Although the present invention has been described with several embodiments, diverse changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. An integrated circuit, comprising:

a heat generating structure within a dielectric region, the dielectric region having a top surface and a bottom surface, the bottom surface of the dielectric region being coupled to a substrate underlying the dielectric region; and one or more substantially horizontally arranged heat dissipation layers within the dielectric region, each heat dissipation layer comprising a plurality of electrically inactive thermally conductive structures, at least two electrically inactive thermally conductive structures in at least one heat dissipation layer being substantially horizontally connected and thermally coupled to one another within the at least one heat dissipation layer, the plurality of electrically inactive thermally conductive structures operating cooperatively to facilitate dissipation of heat from the heat generating structure.

2. The integrated circuit of claim 1, wherein each electrically inactive thermally conductive structure in each heat dissipation layer is substantially horizontally connected and thermally coupled to one or more adjacent electrically inactive thermally conductive structures.

3. The integrated circuit of claim 1, wherein:

the heat generating structure comprises a metal lead; and an electrically inactive thermally conductive structure comprises a dummy metal structure.

4. The integrated circuit of claim 1, comprising at least two heat dissipation layers, at least one electrically inactive thermally conductive structure in a first heat dissipation layer being thermally coupled to at least one electrically inactive thermally conductive structure in a second heat dissipation layer to further facilitate dissipation of heat from the heat generating structure.

5. The integrated circuit of claim 1, wherein at least one electrically inactive thermally conductive structure in a heat dissipation layer is thermally coupled to the substrate to further facilitate dissipation of heat from the heat generating structure.

6. The integrated circuit of claim 1, further comprising one or more electrically inactive thermally conductive structures coupled to the top surface of the dielectric region, each thermally coupled to at least one electrically inactive thermally conductive structure in a heat dissipation layer to further facilitate dissipation of heat from the heat generating structure.

7. The integrated circuit of claim 6, wherein an electrically inactive thermally conductive structure coupled to the top surface of the dielectric layer comprises at least one of a thermal ground plane, a thermal bond pad, a thermal ball, and a thermal bump.

8. The integrated circuit of claim 6, wherein at least one of the thermally conductive structures coupled to the top surface of the dielectric region is further thermally coupled to an external heat sink associated with a package of the integrated circuit.

9. The integrated circuit of claim 6, wherein at least one of the electrically inactive thermally conductive structures coupled to the top surface of the dielectric region is thermally coupled to an electrically inactive thermally conductive border substantially surrounding the integrated circuit to further facilitate dissipation of heat from the heat generating structure.

10. The integrated circuit of claim 1, wherein the electrically inactive thermally conductive structures are embedded within the dielectric region of an interconnect layer of the integrated circuit.

11. The integrated circuit of claim 1, wherein the electrically inactive thermally conductive structures are embedded within the dielectric region of a package substrate of the integrated circuit.

12. A method of fabricating an integrated circuit, comprising:

providing a heat generating structure within a dielectric region, the dielectric region having a top surface and a bottom surface, the bottom surface of the dielectric region being coupled to a substrate underlying the dielectric region;

substantially horizontally arranging one or more heat dissipation layers within the dielectric region, each heat dissipation layer comprising a plurality of electrically inactive thermally conductive structures; and substantially horizontally connecting and thermally coupling at least two electrically inactive thermally conductive structures in at least one heat dissipation layer to one another, the plurality of electrically inactive thermally conductive structures operating cooperatively to facilitate dissipation of heat from the heat generating structure.

13. The method of claim 12, further comprising substantially horizontally connecting and thermally coupling each electrically inactive thermally conductive structure in each heat dissipation layer to one or more adjacent electrically inactive thermally conductive structures.

14. The method of claim 12, wherein:

the heat generating structure comprises a metal lead; and an electrically inactive thermally conductive structure comprises a dummy metal structure.

15. The method of claim 12, further comprising:
providing at least two heat dissipation layers; and
thermally coupling at least one electrically inactive thermally conductive structure in a first heat dissipation layer to at least one electrically inactive thermally conductive structure in a second heat dissipation layer to further facilitate dissipation of heat from the heat generating structure.

16. The method of claim 12, further comprising thermally coupling at least one electrically inactive thermally conductive structure in a heat dissipation layer to the substrate to further facilitate dissipation of heat from the heat generating structure.

17. The method of claim 12, further comprising:
coupling one or more electrically inactive thermally conductive structures to the top surface of the dielectric region; and
thermally coupling each electrically inactive thermally conductive structure that is coupled to the top surface of the dielectric region to at least one electrically inactive thermally conductive structure in a heat dissipation layer to further facilitate dissipation of heat from the heat generating structure.

18. The method of claim 17, wherein an electrically inactive thermally conductive structure coupled to the top surface of the dielectric layer comprises at least one of a thermal ground plane, a thermal bond pad, a thermal ball, and a thermal bump.

19. The method of claim 17, further comprising thermally coupling at least one of the thermally conductive structures coupled to the top surface of the dielectric region to an external heat sink associated with a package of the integrated circuit.

20. The method of claim 17, further comprising thermally coupling at least one of the electrically inactive thermally conductive structures coupled to the top surface of the dielectric region to an electrically inactive thermally conductive border substantially surrounding the integrated circuit to further facilitate dissipation of heat from the heat generating structure.

21. The method of claim 12, wherein the electrically inactive thermally conductive structures are embedded within the dielectric region of an interconnect layer of the integrated circuit.

22. The method of claim 12, wherein the electrically inactive thermally conductive structures are embedded within the dielectric region of a package substrate of the integrated circuit.

23. An integrated circuit, comprising:
one or more heat generating structures within a dielectric region, the dielectric region having a top surface and a bottom surface, the bottom surface of the dielectric region being coupled to a substrate underlying the dielectric region; and
a plurality of electrically inactive thermal posts formed at least partially within the dielectric region and exposed on the top surface of the dielectric region, at least one electrically inactive thermal post being substantially horizontally connected and thermally coupled to another electrically inactive thermal post, the plurality of electrically inactive thermal posts operating cooperatively to facilitate dissipation of heat from the one or more heat generating structures.

24. The integrated circuit of claim 23, wherein each electrically inactive thermal post is substantially horizontally connected and thermally coupled to one or more adjacent electrically inactive thermal posts.

25. The integrated circuit of claim 23, wherein:
a heat generating structure comprises a metal lead; and
an electrically inactive thermal post comprises at least one of a metal and a metal alloy.

26. The integrated circuit of claim 23, wherein the number of electrically inactive thermal posts is selected and the electrically inactive thermal posts are arranged to facilitate a predetermined level of heat dissipation from the one or more heat generating structures.

27. The integrated circuit of claim 23, wherein an exposed portion of at least one electrically inactive thermal post is thermally coupled to an electrically inactive thermally conductive border that substantially surrounds the integrated circuit to further facilitate dissipation of heat from the one or more heat generating structures.

28. The integrated circuit of claim 23, wherein at least one electrically inactive thermal post is thermally coupled to the substrate to further facilitate dissipation of heat from the heat generating structure.

29. The integrated circuit of claim 23, wherein at least one electrically inactive thermal post is further thermally coupled to an external heat sink associated with a package of the integrated circuit.

30. The integrated circuit of claim 23, wherein the one or more heat generating structures are provided before the plurality of electrically inactive thermal posts and the plurality of electrically inactive thermal posts are intelligently arranged about the one or more previously provided heat generating structures.

31. The integrated circuit of claim 23, wherein the plurality of electrically inactive thermal posts are provided before the one or more heat generating structures and the one or more heat generating structures are intelligently arranged according to the locations of the previously provided electrically inactive thermal posts.

32. The integrated circuit of claim 23, wherein the electrically inactive thermal posts are formed at least partially within the dielectric region of an interconnect layer of the integrated circuit.

33. The integrated circuit of claim 23, wherein the electrically inactive thermal posts are formed at least partially within the dielectric region of a package substrate of the integrated circuit.

34. A method of fabricating an integrated circuit, comprising:
providing one or more heat generating structures within a dielectric region, the dielectric region having a top surface and a bottom surface, the bottom surface of the dielectric region being coupled to a substrate underlying the dielectric region;
providing a plurality of electrically inactive thermal posts formed at least partially within the dielectric region and exposed on the top surface of the dielectric region; and
substantially horizontally connecting and thermally coupling at least one electrically inactive thermal post to another electrically inactive thermal post, the plurality of electrically inactive thermal posts operating cooperatively to facilitate dissipation of heat from the one or more heat generating structures.

35. The method of claim 34, further comprising substantially horizontally connecting and thermally coupling each electrically inactive thermal post to one or more adjacent electrically inactive thermal posts.

36. The method of claim 34, wherein:
a heat generating structure comprises a metal lead; and
an electrically inactive thermal post comprises at least one of a metal and a metal alloy.

37. The method of claim 34, further comprising selecting the number of electrically inactive thermal posts and arranging the electrically inactive thermal posts to facilitate a predetermined level of heat dissipation from the one or more heat generating structures.

38. The method of claim 34, further comprising thermally coupling an exposed portion of at least one electrically inactive thermal post to an electrically inactive thermally conductive border that substantially surrounds the integrated circuit to further facilitate dissipation of heat from the one or more heat generating structures.

39. The method of claim 34, further comprising thermally coupling at least one electrically inactive thermal post to the substrate to further facilitate dissipation of heat from the heat generating structure.

40. The method of claim 34, further comprising thermally coupling at least one electrically inactive thermal post to an external heat sink associated with a package of the integrated circuit.

41. The method of claim 34, further comprising:

providing the one or more heat generating structures before the plurality of electrically inactive thermal posts; and intelligently arranging the plurality of electrically inactive thermal posts about the one or more previously provided heat generating structures.

42. The method of claim 34, further comprising:

providing the plurality of electrically inactive thermal posts before the one or more heat generating structures; and intelligently arranging the one or more heat generating structures according to the locations of the previously provided electrically inactive thermal posts.

43. The method of claim 34, wherein the electrically inactive thermal posts are formed at least partially within the dielectric region of an interconnect layer of the integrated circuit.

44. The method of claim 34, wherein the electrically inactive thermal posts are formed at least partially within the dielectric region of a package substrate of the integrated circuit.

\* \* \* \* \*